United States Patent
Sun et al.

(10) Patent No.: US 10,197,787 B2
(45) Date of Patent: Feb. 5, 2019

(54) DISPLAY PANEL, DISPLAY APPARATUS HAVING THE SAME, AND FABRICATING METHOD THEREOF

(71) Applicants: BOE TECHNOLOGY GROUP CO., LTD., Beijing (CN); BEIJING BOE DISPLAY TECHNOLOGY CO., LTD., Beijing (CN)

(72) Inventors: Hanyan Sun, Beijing (CN); Minghui Zhang, Beijing (CN); Inho Park, Beijing (CN); Weitao Chen, Beijing (CN); Junwei Wang, Beijing (CN)

(73) Assignees: BOE TECHNOLOGY GROUP CO., LTD., Beijing (CN); BEIJING BOE DISPLAY TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 15/550,523

(22) PCT Filed: Aug. 30, 2016

(86) PCT No.: PCT/CN2016/097321
§ 371 (c)(1),
(2) Date: Aug. 11, 2017

(87) PCT Pub. No.: WO2018/039905
PCT Pub. Date: Mar. 8, 2018

(65) Prior Publication Data
US 2018/0239125 A1    Aug. 23, 2018

(51) Int. Cl.
*G02B 26/00*    (2006.01)
*G02F 1/01*    (2006.01)
(Continued)

(52) U.S. Cl.
CPC .......... *G02B 26/007* (2013.01); *G02B 26/02* (2013.01); *G02F 1/0131* (2013.01);
(Continued)

(58) Field of Classification Search
CPC ... G02B 26/007; H01L 41/193; H01L 41/319; H01L 41/0986; G06F 3/0412
(Continued)

(56) References Cited

U.S. PATENT DOCUMENTS

2016/0188119 A1    6/2016    Ham et al.

FOREIGN PATENT DOCUMENTS

WO    2010102272 A2    9/2010

OTHER PUBLICATIONS

International Search Report & Written Opinion dated Jun. 5, 2017 regarding PCT/CN2016/097321.

*Primary Examiner* — Tuyen Tra
(74) *Attorney, Agent, or Firm* — Intellectual Valley Law, P.C.

(57) ABSTRACT

The present application discloses a display panel free of a liquid crystal layer including a base substrate, and an array of a plurality of pixels on the base substrate, each of the plurality of pixels comprising at least one subpixel. Each subpixel includes an electroactive layer on the base substrate; and a light transmission layer on the base substrate configured to be actuated by the electroactive layer so that light transmittance of the light transmission layer in the at least one subpixel changes in response to a change in an electrical signal applied to the electroactive layer to achieve levels of gray scale; wherein the light transmission layer is reversibly deformable.

20 Claims, 7 Drawing Sheets

(51) Int. Cl.
*G02B 26/02* (2006.01)
*H01L 41/09* (2006.01)
*H01L 41/193* (2006.01)
*H01L 41/319* (2013.01)

(52) U.S. Cl.
CPC ........ *H01L 41/0986* (2013.01); *H01L 41/193* (2013.01); *H01L 41/319* (2013.01)

(58) Field of Classification Search
USPC .................................. 359/291, 290, 491.01
See application file for complete search history.

DISPLAY PANEL, DISPLAY APPARATUS HAVING THE SAME, AND FABRICATING METHOD THEREOF

CROSS-REFERENCE TO RELATED APPLICATION

This application is a national stage application under 35 U.S.C. § 371 of International Application No. PCT/CN2016/097321 filed Aug. 30, 2016, the contents of which are incorporated by reference in the entirety.

TECHNICAL FIELD

The present invention relates to a display panel, a display apparatus having the same, and a fabricating method thereof.

BACKGROUND

The liquid crystal display panels in general have the disadvantages of high manufacturing costs, low reflectivity, poor contrast ratios, and having mura defects due to non-uniform distribution and alignment of the liquid crystal molecules. In recent years, development of high resolution, low cost, light weight, ultra-thin, "liquid crystal-less" display panels has become a focus of research in display technology.

SUMMARY

In one aspect, the present invention provides a display panel free of a liquid crystal layer comprising a base substrate, and an array of a plurality of pixels on the base substrate, each of the plurality of pixels comprising at least one subpixel; wherein each subpixel comprises an electroactive layer on the base substrate; and a light transmission layer on the base substrate configured to be actuated by the electroactive layer so that light transmittance of the light transmission layer in the at least one subpixel changes in response to a change in an electrical signal applied to the electroactive layer to achieve levels of gray scale; wherein the light transmission layer is reversibly deformable.

Optionally, the electroactive layer is connected to the light transmission layer for changing the light transmittance of the light transmission layer based on a voltage signal applied to the electroactive layer.

Optionally, the light transmission layer is thickness variable for changing the light transmittance of the light transmission layer.

Optionally, the electroactive layer is configured to exert a force to the light transmission layer for changing a thickness of the light transmission layer in response to a change in the voltage signal applied to the electroactive layer.

Optionally, the electroactive layer is configured to exert a pressing force to the light transmission layer for increasing the thickness of the light transmission layer in response to the increase in positive direction and/or a decrease in negative direction in the voltage signal applied to the electroactive layer, and configured to exert a pulling force to the light transmission layer for decreasing the thickness of the light transmission layer in response to the increase in negative direction and/or a decrease in positive direction in the voltage signal applied to the electroactive layer.

Optionally, the display panel further comprises a black matrix layer; wherein each pixel includes a subpixel region and an inter-subpixel region; the black matrix layer being in the inter-subpixel region; and the light transmission layer being in the subpixel region.

Optionally, the electroactive layer comprises a first portion connected to the light transmission layer and the black matrix layer respectively; wherein the light transmission layer is sandwiched by the first portion and the black matrix layer.

Optionally, the electroactive layer comprises a first portion connected to the light transmission layer and the black matrix layer respectively; and a second portion connected to the light transmission layer and the black matrix layer respectively; wherein the light transmission layer is sandwiched by the first portion and the second portion.

Optionally, the light transmission layer is spaced apart from the base substrate by a gap distance variable based on a deformation of the light transmission layer.

Optionally, the display panel further comprises a color generating layer; wherein each pixel comprises at least a first subpixel, a second subpixel, and a third subpixel, for emitting light of a first color, light of a second color and light of a third color, respectively; and the color generating layer comprises a first color generating block corresponding to the first subpixel, a second color generating block corresponding to the second subpixel, and a third color generating block corresponding to the third subpixel.

Optionally, the light transmission layer is the color generating layer; the light transmission layer comprises a first light transmission block corresponding to the first subpixel, a second light transmission block corresponding to the second subpixel, and a third light transmission block corresponding to the third subpixel; light transmitted through the first light transmission block having the first color, light transmitted through the second light transmission block having the second color, and light transmitted through the third light transmission block having the third color, and the first color, the second color, and the third color are different colors selected form red, green, and blue.

Optionally, the electroactive layer is made of barium titanate doped polyurethane.

Optionally, the light transmission layer is made of a polydimethylsiloxane (PDMS)-based material.

In another aspect, the present invention provides a method of fabricating a display panel, comprising forming an electroactive layer comprising a plurality of electroactive blocks on a base substrate; and forming a light transmission layer comprising a plurality of light transmission blocks on the base substrate corresponding to a plurality of subpixels.

Optionally, each of the plurality of light transmission block is formed to be spaced apart from the base substrate by a gap distance.

Optionally, the method comprises forming a sacrificial layer on the base substrate; forming the electroactive layer and the light transmission layer on a side of sacrificial layer distal to the base substrate; and removing the sacrificial layer thereby forming a gap having the gap distance between each of the plurality of light transmission block and the base substrate.

Optionally, the sacrificial layer is made of a photoresist material, and the step of removing is performed by dissolving the sacrificial layer using an alkaline developing solution.

Optionally, the sacrificial layer is made of a thermally decomposable material, and the step of removing is performed by decomposing the sacrificial layer by heat.

Optionally, the method further comprises forming a black matrix layer on the base substrate.

Optionally, the step of forming the black matrix layer comprises forming a plurality of black matrix islands on the base substrate prior to the step of forming the sacrificial layer, each of the plurality of light transmission blocks and each of the plurality of electroactive blocks are formed between two adjacent black matrix islands; and subsequent to the step of removing the sacrificial layer, forming a plurality of black matrix bridges connecting the plurality of black matrix islands to form the black matrix layer.

In another aspect, the present invention provides a display apparatus comprising a display panel described herein or fabricated by a method described herein.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now describe more specifically with reference to the following embodiments. It is to be noted that the following descriptions of some embodiments are presented herein for purpose of illustration and description only. It is not intended to be exhaustive or to be limited to the precise form disclosed.

The present disclosure provides a display panel, a display apparatus having the same, and a fabricating method thereof that substantially obviate one or more of the problems due to limitations and disadvantages of the related art. In one aspect, the present disclosure provides a novel display panel that does not require a liquid crystal layer. In some embodiments, the light transmission (or lack of the light transmission) in each subpixel is modulated by a light transmission layer, which is actuated by an electroactive layer connected, directly or indirectly (e.g., through an interconnecting layer) to the light transmission layer. Accordingly, in some embodiments, the present display panel includes a base substrate, and an array of a plurality of pixels on the base substrate, each of the plurality of pixels includes at least one subpixel. Optionally, each subpixel includes an electroactive layer on the base substrate; and a light transmission layer on the base substrate configured to be actuated by the electroactive layer. Light transmittance of the light transmission layer in each subpixel changes in response to a change in a strength of an electrical signal applied to the electroactive layer. The light transmission layer is reversibly deformable.

Figure 1:
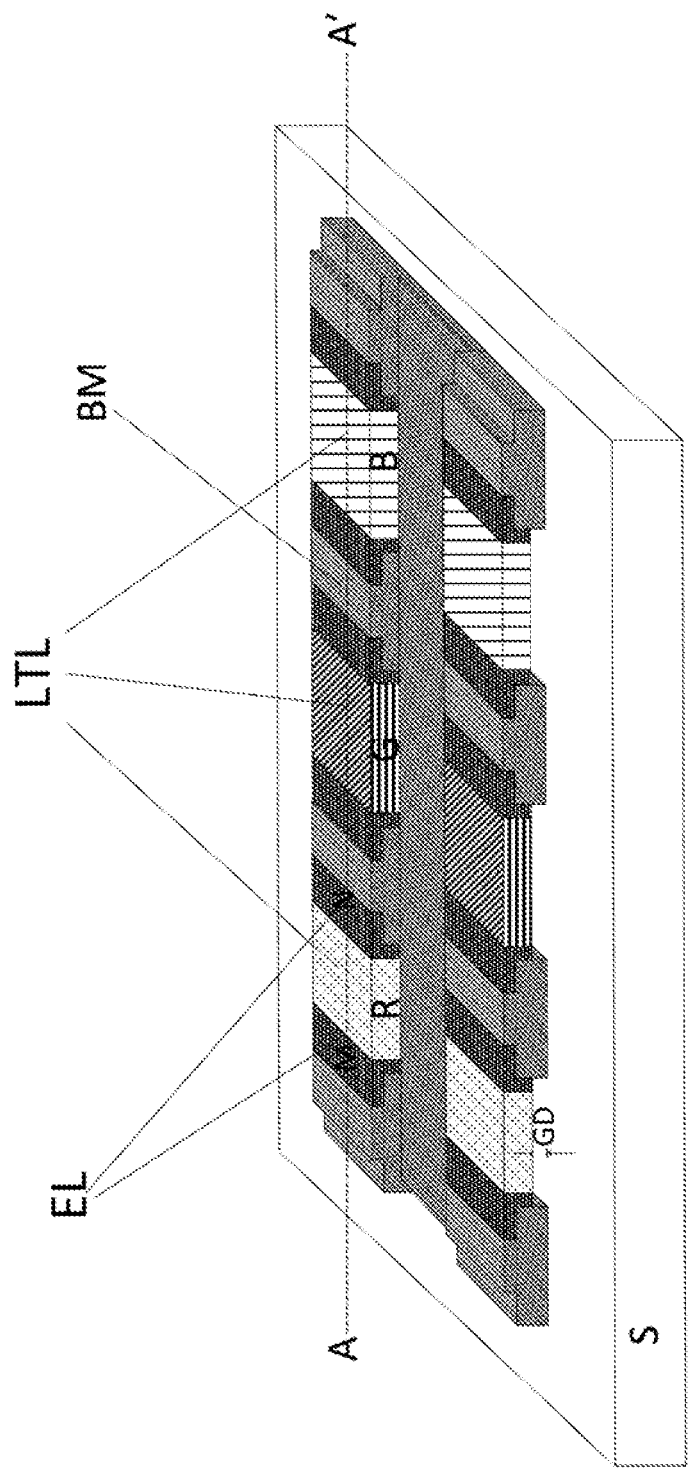
FIG. 1 is a diagram illustrating the structure of a display panel in some embodiments.
Figure 2:
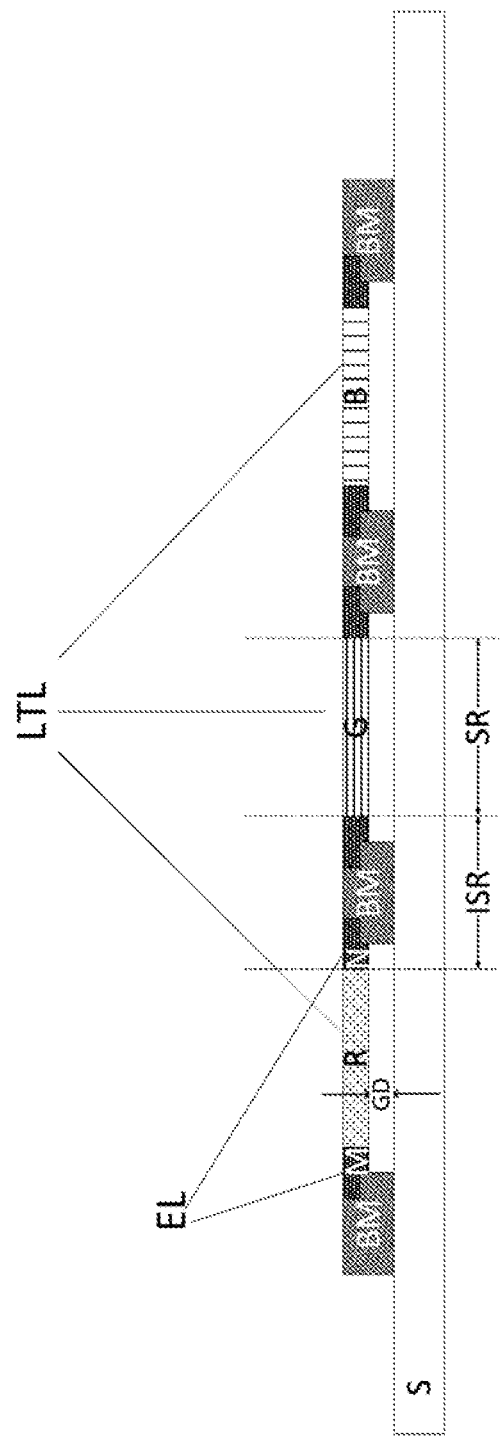
FIG. 2 shows a cross-sectional view along the A-A' direction of the display panel in FIG. 1.

FIG. 1 is a diagram illustrating the structure of a display panel in some embodiments. FIG. 2 shows a cross-sectional view along the A-A' direction of the display panel in FIG. 1. Referring to FIGS. 1 and 2, the display panel in the embodiment includes a base substrate S, and an array of pixels on the base substrate S. In some embodiments, each pixel includes an electroactive layer EL on the base substrate S; and a light transmission layer LTL on the base substrate S. The light transmission layer LTL is made of a reversibly deformable material, i.e., the light transmission layer LTL is reversibly deformable. According to the present disclosure, the light transmission layer LTL is configured to be actuated by the electroactive layer EL so that light transmittance of the light transmission layer LTL changes in response to a change in a strength of an electrical signal applied to the electroactive layer EL. In some embodiments, the light transmittance of the light transmission layer decreases in response to an increase in positive direction and/or a decrease in negative direction in a voltage applied to the electroactive layer (e.g., from 1 V to 3 V, from −3 V to −1 V, or from −1.5 V to 1.5 V), and increases in response to an increase in negative direction and/or a decrease in positive direction in the voltage applied to the electroactive layer (e.g., from −1 V to −3 V, from 3 V to 1 V, or from 1.5 V to −1.5 V).

For example, the present display panel may be used in combination with a back light in a display apparatus, in which the back light provides light for image display in each pixel. Each pixel in the display panel may include at least one subpixel. Light transmittance through the light transmission layer LTL in each subpixel may be controlled by transmitting an electrical signal (e.g., a voltage signal) to the electroactive layer EL to actuate the light transmission layer LTL. Depending on a strength and a polarity of the electrical signal applied to the electroactive layer EL, the light transmission layer LTL may be actuated from a substantially light non-transmissive state gradually to a substantially light transmissive state, and vice versa. In some embodiments, the display panel further includes a plurality of data lines for providing the electrical signals to be applied to the electroactive layers in a plurality of subpixels. In some embodiments, the display panel further includes a plurality of thin film transistors and a plurality of gate lines for controlling the image display in the array of pixels. Luminance in each individual subpixel can be controlled by varying the strength and the polarity of electrical signal provided to each subpixel.

In some embodiments, the change in light transmittance of the light transmission layer LTL occurs as a result of a change in a thickness of the light transmission layer LTL in response to the change in the electrical signal applied to the electroactive layer EL. For example, the light transmittance of the light transmission layer LTL may decrease as the thickness of the light transmission layer LTL increases in response to an increase in positive voltage (e.g., from 0 V to 3 V) applied to the electroactive layer EL, and then the light transmittance of the light transmission layer LTL may increase as the thickness of the light transmission layer LTL decreases in response to a decrease in positive voltage (e.g., from 3 V to 0 V) applied to the electroactive layer EL. For another example, the light transmittance of the light transmission layer LTL may increase as the thickness of the light transmission layer LTL decreases in response to an increase in negative voltage (e.g., from 0 V to −3 V) applied to the electroactive layer EL, and then the light transmittance of the light transmission layer LTL may decrease as the thickness of the light transmission layer LTL increases in response to a decrease in negative voltage (e.g., from −3 V to 0 V) applied to the electroactive layer EL.

In some embodiments, the change in light transmittance of the light transmission layer LTL occurs as a result of a change in a length or width of the light transmission layer LTL in response to the change in the electrical signal applied to the electroactive layer EL. In some embodiments, the light transmittance of the light transmission layer LTL may increase as the length or width of the light transmission layer LTL increases in response to an increase in negative direction and/or a decrease in positive direction in a voltage applied to the electroactive layer EL, and the light transmittance of the light transmission layer LTL may decrease as the length or width of the light transmission layer LTL decreases in response to an increase in positive direction and/or a decrease in negative direction in a voltage applied to the electroactive layer EL. For example, the light transmittance of the light transmission layer LTL may increase as the length or width of the light transmission layer LTL increases in response to an increase in negative voltage applied to the electroactive layer EL, and then the light transmittance of the light transmission layer LTL may decrease as the length or width of the light transmission layer LTL decreases in response to a decrease in negative voltage applied to the electroactive layer EL. For another example, the light transmittance of the light transmission layer LTL may decrease as the length or width of the light transmission layer LTL decreases in response to an increase in positive voltage applied to the electroactive layer EL, and then the light transmittance of the transmission layer LTL may increase as the length or width of the light transmission layer LTL increases in response to a decrease in positive voltage applied to the electroactive layer EL.

In some embodiments, the change in light transmittance of the light transmission layer LTL occurs as a result of a change in a surface area of the light transmission layer LTL in response to the change in the electrical signal applied to the electroactive layer EL. In some embodiments, the light transmittance of the light transmission layer LTL may increase as the surface area of the light transmission layer LTL increases in response to an increase in negative direction and/or a decrease in positive direction in a voltage applied to the electroactive layer EL, and the light transmittance of the light transmission layer LTL may decrease as the surface area of the light transmission layer LTL decreases in response to an increase in positive direction and/or a decrease in negative direction in a voltage applied to the electroactive layer EL. For example, the light transmittance of the light transmission layer LTL may increase as the surface of the light transmission layer LTL increases in response to an increase in negative voltage applied to the electroactive layer EL, and then the light transmittance of the light transmission layer LTL may decrease as the surface of the light transmission layer LTL decreases in response to a decrease in negative voltage applied to the electroactive layer EL. For another example, the light transmittance of the light transmission layer LTL may decrease as the surface of the light transmission layer LTL decreases in response to an increase in positive voltage applied to the electroactive layer EL, and then the light transmittance of the transmission layer LTL may increase as the surface of the light transmission layer LTL increases in response to a decrease in positive voltage applied to the electroactive layer EL.

When an electrical signal is applied to the electroactive layer EL, the electrical signal reversibly changes one or more characteristic body dimension of the electroactive layer EL, i.e., the electroactive layer EL exhibits a distortion upon receiving the applied electrical signal. As a result of this distortion, the electroactive layer may reversibly expand or retract in one or more dimension, and the expansion or retraction of the electroactive layer EL presses or pulls the light transmission layer LTL. The light transmission layer LTL is coupled to (e.g., in contact with) the electroactive layer EL so that the electroactive layer EL may exert a force to the light transmission layer LTL when it reversibly expands or retracts in one or more dimension. In some embodiments, the electroactive layer EL exerts a force to the light transmission layer LTL for changing the thickness (or the length, the width, or the surface area) of the light transmission layer LTL in response to the change in the strength of the electrical signal applied to the electroactive layer EL.

In some embodiments, the change in light transmittance of the light transmission layer LTL occurs as a result of a change in a length or width of the electroactive layer EL in response to the change in the electrical signal applied to the electroactive layer EL. In some embodiments, the light transmittance of the light transmission layer LTL may decrease as the length or width of the electroactive layer EL increases in response to an increase in positive direction and/or a decrease in negative direction in a voltage applied to the electroactive layer EL, and the light transmittance of the light transmission layer LTL may increase as length or width of the electroactive layer EL decreases in response to an increase in negative direction and/or a decrease in positive direction in a voltage applied to the electroactive layer EL. For example, the light transmittance of the light transmission layer LTL may increase as the length or width of the electroactive layer EL decreases in response to an increase in negative voltage applied to the electroactive layer EL, and then the light transmission layer LTL may decrease as length or width of the electroactive layer EL increases in response to a decrease in negative voltage applied to the electroactive layer EL. For another example, the light transmittance of the light transmission layer LTL may decrease as the length or width of the electroactive layer EL increases in response to an increase in positive voltage applied to the electroactive layer EL, and then the light transmittance of the transmission layer LTL may increase as the length or width of the electroactive layer EL decreases in response to a decrease in positive voltage applied to the electroactive layer EL.

In some embodiments, the change in light transmittance of the light transmission layer LTL occurs as a result of a change in a length of the electroactive layer EL along a polarization direction of the electroactive layer EL in response to the change in the electrical signal applied to the electroactive layer EL. For example, when the electroactive layer EL is made of certain piezoelectric material, the piezoelectric material needs to be first poled to obtain a polarization direction by a poling process, in which a DC voltage is induced across the piezoelectric material so that ferroelectric domains of the piezoelectric material align to the induced electric field. Accordingly, in some embodiments, the light transmittance of the light transmission layer LTL may decrease as the length of the electroactive layer EL along a polarization direction of the electroactive layer EL increases in response to an increase in positive direction and/or a decrease in negative direction in a voltage applied to the electroactive layer EL, and the light transmittance of the light transmission layer LTL may increase as length of the electroactive layer EL along a polarization direction of the electroactive layer EL decreases in response to an increase in negative direction and/or a decrease in positive direction in a voltage applied to the electroactive layer EL. For example, the light transmittance of the light transmission layer LTL may increase as the length of the electroactive layer EL along a polarization direction of the electroactive layer EL decreases in response to an increase in negative voltage applied to the electroactive layer EL, and then the light transmission layer LTL may decrease as length of the electroactive layer EL along a polarization direction of the electroactive layer EL increases in response to a decrease in negative voltage applied to the electroactive layer EL. For another example, the light transmittance of the light transmission layer LTL may decrease as the length of the electroactive layer EL along a polarization direction of the electroactive layer EL increases in response to an increase in positive voltage applied to the electroactive layer EL, and then the light transmittance of the transmission layer LTL may increase as the length of the electroactive layer EL along a polarization direction of the electroactive layer EL decreases in response to a decrease in positive voltage applied to the electroactive layer EL.

In some embodiments, the change in light transmittance of the light transmission layer LTL occurs as a result of a change in a thickness of the electroactive layer EL in response to the change in the electrical signal applied to the electroactive layer EL. In some embodiments, the light transmittance of the light transmission layer LTL may decrease as the thickness of the electroactive layer EL decreases in response to an increase in positive direction and/or a decrease in negative direction in a voltage applied to the electroactive layer EL, and the light transmittance of the light transmission layer LTL may increase as the thickness of the electroactive layer EL increases in response to an increase in negative direction and/or a decrease in positive direction in a voltage applied to the electroactive layer EL. For example, the light transmittance of the light transmission layer LTL may increase as the thickness of the electroactive layer EL increases in response to an increase in negative voltage applied to the electroactive layer EL, and then the light transmittance of the light transmission layer LTL may decrease as the thickness of the electroactive layer EL decreases in response to a decrease in negative voltage applied to the electroactive layer EL. For another example, the light transmittance of the light transmission layer LTL may decrease as the thickness of the electroactive layer EL decreases in response to an increase in positive voltage applied to the electroactive layer EL, and then the light transmittance of the transmission layer LTL may increase as the thickness of the electroactive layer EL increases in response to a decrease in positive voltage applied to the electroactive layer EL.

In some embodiments, the change in light transmittance of the light transmission layer LTL occurs as a result of a change in a surface area of the electroactive layer EL in response to the change in the electrical signal applied to the electroactive layer EL. In some embodiments, the light transmittance of the light transmission layer LTL may decrease as the surface area of the light electroactive layer EL increases in response to an increase in positive direction and/or a decrease in negative direction in a voltage applied to the electroactive layer EL, and the light transmittance of the light transmission layer LTL may increase as the surface area of the electroactive layer EL decreases in response to an increase in negative direction and/or a decrease in positive direction in a voltage applied to the electroactive layer EL. For example, the light transmittance of the light transmission layer LTL may increase as surface area of the electroactive layer EL decreases in response to an increase in negative voltage applied to the electroactive layer EL, and then the light transmittance of the light transmission layer LTL may decrease as surface area of the electroactive layer EL increases in response to a decrease in negative voltage applied to the electroactive layer EL. For another example, the light transmittance of the light transmission layer LTL may decrease as the surface area of the electroactive layer EL increases in response to an increase in positive voltage applied to the electroactive layer EL, and then the light transmittance of the transmission layer LTL may increase as surface area of the electroactive layer EL decreases in response to a decrease in positive voltage applied to the electroactive layer EL.

In some embodiments, light transmittance of a light transmission layer may be a function of a pulling force exerted to the light transmission layer. When no force is exerted to the light transmission layer (the light transmission layer in a relaxed state), the light transmittance is low, e.g., the light transmission layer is in a substantially light non-transmissive state (opaque layer in the left panel). As the pulling force exerted on the light transmission layer gradually increases in response to an increase in negative direction in the voltage applied to the electroactive layer, the light transmittance increases, e.g., the light transmission layer gradually transitions from the substantially light non-transmissive state to a substantially light transmissive state (e.g., a substantially transparent layer). The thickness of the light transmission layer decreases as the pulling force exerted to the light transmission layer increases. The length or width of the light transmission layer increases as the pulling force exerted to the light transmission layer increases. The surface area of the light transmission layer increases as the pulling force exerted to the light transmission layer increases.

In some embodiments, light transmittance of a light transmission layer may be a function of a pressing force exerted to the light transmission layer. When the light transmission layer is originally in a stretched state, the light transmission layer is in a light transmissive state. As the pressing force exerted on the light transmission layer gradually increases in response to an increase in positive direction in a voltage applied to the electroactive layer, the light transmittance decreases, e.g., the light transmission layer gradually transitions from the light transmissive state to a substantially light non-transmissive state (e.g., a relaxed state). The thickness of the light transmission layer increases as the pressing force exerted to the light transmission layer increases. The length or width of the light transmission layer decreases as the pressing force exerted to the light transmission layer increases. The surface area of the light transmission layer decreases as the pressing force exerted to the light transmission layer increases.

The light transmittance of the light transmission layer may be expressed as $T=T_0^\lambda$, wherein T is light transmittance when a force is exerted to the light transmission layer, $T_0$ is an initial light transmittance (e.g., when no force is exerted to the light transmission layer), $\lambda$ is a tensile factor that can be determined as $h/h_0$, $h_0$ is an initial thickness of the light transmission layer (e.g., a thickness of the light transmission layer when no force is exerted to the light transmission layer), h is a thickness of the light transmission layer when a force is exerted to the light transmission layer. $T_0$ may be determined as $T_0=10^{-\varepsilon c h_0}$, wherein $h_0$ is an initial thickness of the light transmission layer (e.g., a thickness of the light transmission layer when no force is exerted to the light transmission layer), $\varepsilon$ is a constant, and c is a doping concentration of a dopant (e.g., a dye) in the light transmission layer. Light transmittance of a light transmission layer increases as a thickness of the light transmission layer decreases. Optionally, light transmittance of a light transmission layer increases as a length or width of the light transmission layer increases. Optionally, light transmittance of a light transmission layer increases as a surface area of the light transmission layer increases.

As used herein the term "electroactive material" refers to a material that reversibly changes one or more characteristic body dimension by an amount depending on an applied electrical voltage. As used herein, the term "electroactive layer" refers to a layer in the present display panel that includes an electroactive material, and is capable of reversibly changing one or more characteristic body dimension by an amount depending on an applied electrical voltage. Optionally, the electroactive material is an electrostrictive material. Stress and strain response of the electrostrictive material to an electric field is proportional to the square of the electric field. Optionally, the electroactive material is a piezoelectric material. Stress and strain response of the piezoelectric material to an electric field is proportional to the electric field.

Figure 3:
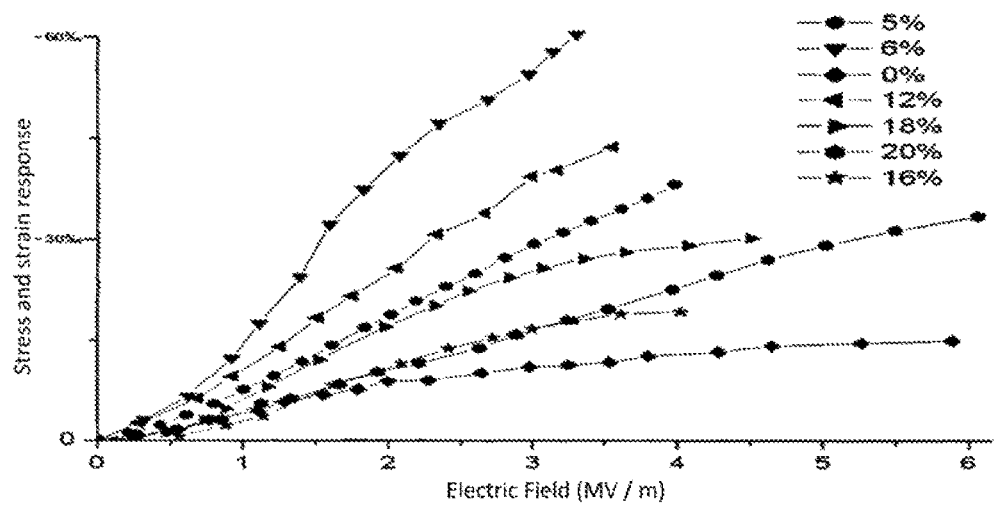
FIG. 3 shows a correlation between stress and strain response of an electrostrictive material and a strength of an electric field applied to the electrostrictive material in some embodiments.

For example, the stress and strain response to the electric field applied to the electrostrictive material may be expressed as $X=RE^2$, wherein X is the stress and strain response, R is an electrostrictive coefficient of the material, and E is a strength of the electric field applied to the electrostrictive material. FIG. 3 shows a correlation between stress and strain response of an electrostrictive material and a strength of an electric field applied to the electrostrictive material in some embodiments. Referring to FIG. 3, the electrostrictive materials used in the example are polyurethane doped with various concentrations of barium titanate. In FIG. 3, the polyurethane materials are made to have a width of approximately 1 mm, and are applied with various voltages at two ends. Among all materials tested, a maximum stress and strain response was found in a sample containing polyurethane doped with 6% of barium titanate. For example, a voltage of 3 V (equivalent to an electric field of 1 MV/m) applied to the sample having polyurethane doped with 6% of barium titanate results in a more than 15% stress and strain response. The stress and strain response of the electrostrictive material is also affected by the thickness of the material. Within a certain range of thicknesses (e.g., in the range of approximately 0.1 mm to approximately 2 mm), X is proportional to the square of the electric field, R increases as the thickness of the material decreases. Thus, a relatively larger coefficient R results in more prominent stress and strain response X, when a same electric field is applied to the electrostrictive material.

Any appropriate electrostrictive material may be used for making the electroactive layer, e.g., electrostrictive ceramics, electrostrictive polymers, electrostrictive valves, etc. Examples of appropriate electrostrictive materials include, but are not limited to, a polyurethane containing material (e.g., a doped polyurethane material), polyvinylidene fluoride, lead magnesium niobate, lead magnesium niobate-lead titanate, lanthanum doped lead zirconate titanate, barium doped lead zirconate titanate, and various substitutes and derivatives thereof (e.g., doped with one or more dopant).

Any appropriate piezoelectric material may be used for making the electroactive layer. Examples of appropriate piezoelectric materials include, but are not limited to, lead zirconium titanate, berlinite, zinc oxide, barium titanate, lead titanate, and various substitutes and derivatives thereof (e.g., doped with one or more dopant).

Any appropriate material may be used for making the reversibly deformable light transmission layer, e.g., optical plastic materials and optical elastic polymers. Examples of appropriate reversibly deformable light transmission layer material include, but are not limited to, organosilane polymer such as PDMS, polycarbonate, polystyrene, and polymethylmethacrylate, and various substitutes and derivatives thereof.

Referring to FIGS. 1 and 2, the electroactive layer EL in the embodiments includes a first portion M and a second portion N. The first portion M and the second portion N sandwich the light transmission layer LTL in-between, and exert a force to the light transmission layer LTL for changing the thickness of the light transmission layer LTL in response to the change in the electrical signal applied to the electroactive layer EL, and in turn changing the light transmittance of the light transmission layer LTL. Specifically, a distance between the first portion M and the second portion N changes in response to the change in the electrical signal applied to the electroactive layer EL. For example, the distance between the first portion M and the second portion N may increase in response to an increase in negative direction and/or or a decrease in positive direction in the voltage applied to the electroactive layer EL (e.g., from 0 to −3V, −1 V to −3 V, from 3V to 1 V, from 3 V to 0, or from 1.5 V to −1.5 V), and may decrease in response to an increase in positive direction and/or a decrease in negative direction in a voltage applied to the electroactive layer (e.g., from 1 V to 3 V, from −3 V to −1 V, from 0 to 3V, from −3 V to 0, or from −1.5 V to 1.5 V). The light transmission layer LTL is coupled to the first portion M and the second portion N, i.e. the light transmission layer LTL undergoes deformation together with the electroactive layer EL as the stress and strain response occurs in the electroactive layer EL in response to a change in the electrical signal applied to the electroactive layer EL. Optionally, the light transmission layer LTL is in contact with the electroactive layer EL. Optionally, the light transmission layer LTL is secured together with the electroactive layer EL. As the distance between the first portion M and the second portion N decreases, the first portion M and the second portion N press upon the light transmission layer LTL, i.e., exerting a pressing force upon the light transmission layer LTL. The thickness of the light transmission layer LTL increases when it is pressed upon by the first portion M and the second portion N, and the light transmittance of the light transmission layer LTL decreases correspondingly. As the distance between the first portion M and the second portion N increases, the first portion M and the second portion N pull the light transmission layer LTL towards the first portion M and the second portion N, respectively, i.e., exerting a pulling force upon the light transmission layer LTL. The thickness of the light transmission layer LTL decreases when it is pulled by the first portion M and the second portion N, and the light transmittance of the light transmission layer LTL increases correspondingly.

Numerous alternative embodiments may be practiced to make the electroactive layer EL. In some embodiments, the electroactive layer EL include a single portion for exerting a force to the light transmission layer LTL. In some embodiments, the electroactive layer EL includes more than two portions for exerting a force to the light transmission layer LTL. Similarly, the electroactive layer EL and any portion thereof may have any appropriate shape as long as the light transmission layer LTL may be sufficiently actuated by the electroactive layer EL so that light transmittance of the light transmission layer LTL in each subpixel may be adjusted in response to a change in an electrical signal applied to the electroactive layer EL.

Referring to FIGS. 1 and 2, the light transmission layer LTL in the embodiments is spaced apart from the base substrate S by a gap distance GD. The gap between the light transmission layer LTL and the base substrate S provides a space, into which the light transmission layer LTL may expand into, when the thickness of the light transmission layer LTL increases. In some embodiments, the gap distance GD decreases as the thickness of the light transmission layer LTL increases in response to an increase in positive direction and/or a decrease in negative direction in a voltage applied to the electroactive layer (e.g., from 1 V to 3 V, from −3 V to −1 V, from 0 to 3V, from −3 V to 0, or from −1.5 V to 1.5 V), and increases as the thickness of the light transmission layer LTL decreases in response to an increase in negative direction and/or a decrease in positive direction in the voltage applied to the electroactive layer (e.g., from 0 to −3V, −1 V to −3 V, from 3 V to 1 V, from 3V to 0, or from 1.5 V to −1.5 V).

Various alternative embodiments may be practiced to make the present display panel. In some embodiments, the gap distance is provided on a side of the light transmission layer distal to the base substrate. For example, the display panel may further include a cover glass on a side of the light transmission layer distal to the base substrate. The gap between the light transmission layer and the cover glass may be provided for accommodating the expansion of the light transmission layer when the thickness of the light transmission layer LTL increases. In some embodiments, the gap may be filled with an inert gas, air or vacuum.

Referring to FIGS. 1 and 2, the present display panel may further include a black matrix layer BM. In some embodiments, each pixel includes a subpixel region SR and an inter-subpixel region ISR. The black matrix layer BM is disposed in the inter-subpixel region ISR, and the light transmission layer LTL is disposed in the subpixel region SR. As used herein, a subpixel region refers to a light emission region of a subpixel, such as a region corresponding to a pixel electrode in a liquid crystal display, a region corresponding to a light emissive layer in an organic light emitting display, or a region corresponding to the light transmission layer in the present disclosure. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, a region corresponding a pixel definition layer in an organic light emitting display, or a black matrix in the present display panel. Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

In some embodiments, the display panel further includes a color generating layer for color image display. Optionally, each pixel includes at least a first subpixel, a second subpixel, and a third subpixel, for emitting light of a first color, light of a second color and light of a third color, respectively. The color generating layer includes a first color generating block corresponding to the first subpixel, a second color generating block corresponding to the second subpixel, and a third color generating block corresponding to the third subpixel.

As defined herein, the term "color generating layer" encompasses both (1) a layer having light absorptive material that absorbs light of one frequency range but largely transmits light of a different frequency range; and (2) a layer having color-changing material or color-converting material that absorbs light of one frequency range and re-emits light at a second, lower frequency range. Optionally, the color generating layer is a color filter. Optionally, the color generating layer includes quantum dots. The color generating layer may be a red color generating layer, a green color generating layer, a blue color generating layer, and a white color generating layer, etc. Optionally, the color generating layer may be a red color filter, a green color filter, a blue color filter, and a white color filter, etc.

Various embodiments may be practice to implement the color generating layer in the present display panel. Optionally, the color generating layer is disposed on a side of the light transmission layer distal to the base substrate. Optionally, the color generating layer is disposed on a side of the light transmission layer proximal to the base substrate. Optionally, the light transmission layer is both a light transmission layer as described herein and at the same time a color generating layer for color image display. For example, the light transmission layer may include a first light transmission block corresponding to the first subpixel, a second light transmission block corresponding to the second subpixel, and a third light transmission block corresponding to the third subpixel. The first light transmission block may be doped with a dye of the first color and functions as a first color filter. The second light transmission block may be doped with a dye of the second color and functions as a second color filter. The third light transmission block may be doped with a dye of the third color and functions as a third color filter. Light transmitted through the first light transmission block has the first color, light transmitted through the second light transmission block has the second color, and light transmitted through the third light transmission block has the third color.

Referring to FIGS. 1 and 2, the light transmission layer LTL in the embodiment includes a red light transmission block R, a green light transmission block G, and a blue light transmission block B. Light transmitted through the red light transmission block having a red color, light transmitted through the green light transmission block has a green color, and light transmitted through the third light transmission block has a blue color. Optionally, the display panel further include subpixel of other colors, e.g., a white subpixel for emitting white light or a yellow subpixel for emitting yellow light.

In another aspect, the present disclosure provides a method of fabricating a display panel. In some embodiments, the method includes forming an electroactive layer comprising a plurality of electroactive blocks on a base substrate; and forming a light transmission layer comprising a plurality of light transmission blocks on the base substrate corresponding to a plurality of subpixels. In a display panel so formed, the light transmittance of the light transmission layer in each subpixel changes in response to a change in an electrical signal applied to the electroactive layer, as described herein.

In some embodiments, the light transmission block is formed to be spaced apart from other portions of the display panel either on a side of the light transmission block distal to the base substrate or on a side of the light transmission block proximal to the base substrate. For example, the display panel may further include a cover glass on a side of the light transmission layer distal to the base substrate. The light transmission block is formed to be spaced apart from the cover glass by a gap distance.

In some embodiments, the light transmission block is formed to be spaced apart from the base substrate by a gap distance. Optionally, the gap distance may be formed by first forming a sacrificial layer between the light transmission block and the base substrate, following by removing the sacrificial layer thereby forming a gap between the light transmission block and the base substrate. In some embodiments, the method includes forming a sacrificial layer on the base substrate; forming the electroactive layer and the light transmission layer on a side of sacrificial layer distal to the base substrate; and removing the sacrificial layer thereby forming the gap distance between each of the plurality of light transmission block and the base substrate. The sacrificial layer may be made of various appropriate materials. In one example, the sacrificial layer is made of a photoresist material. The photoresist sacrificial layer is removed by dissolving the sacrificial layer using an alkaline developing solution. In another example, the sacrificial layer is made of a thermally decomposable material. The thermally decomposable sacrificial layer is removed by decomposing the sacrificial layer by heat.

In some embodiments, the method further includes forming a black matrix layer on the base substrate in the inter-subpixel region. Optionally, the black matrix layer is formed in a two-step process. First, the plurality of black matrix islands is formed on the base substrate prior to the step of forming the sacrificial layer. Subsequent to the formation of the plurality of black matrix islands, the sacrificial layer, the electroactive layer, and the light transmission layer are formed on the base substrate. Each of the plurality of light transmission blocks and each of the plurality of electroactive blocks are formed between two adjacent black matrix islands. Subsequent to the step of removing the sacrificial layer, the method further includes forming a plurality of black matrix bridges connecting the plurality of black matrix islands to form the black matrix layer.

Figure 4A:
FIG. 4A-D illustrate a process of fabricating a display panel in some embodiments.

FIG. 4A-D illustrate a process of fabricating a display panel in some embodiments. FIG. 5A-E illustrate a process of fabricating a display panel in some embodiments. Referring to FIGS. 4A and 5A, the method in the embodiments includes forming a plurality of black matrix islands BMI on the base substrate S. As shown in FIGS. 4A and 5A, the black matrix island BMI may have a step shape (e.g., an upside down T-shape have two steps on two sides). The electroactive layer EL may be formed onto the step of the black matrix island BMI. By having this design, the step of the black matrix island BMI provides support for the electroactive block, confining the expansion and retraction of the electroactive block between two adjacent black matrix islands BMI.

Figure 4B:
Figure 5A:
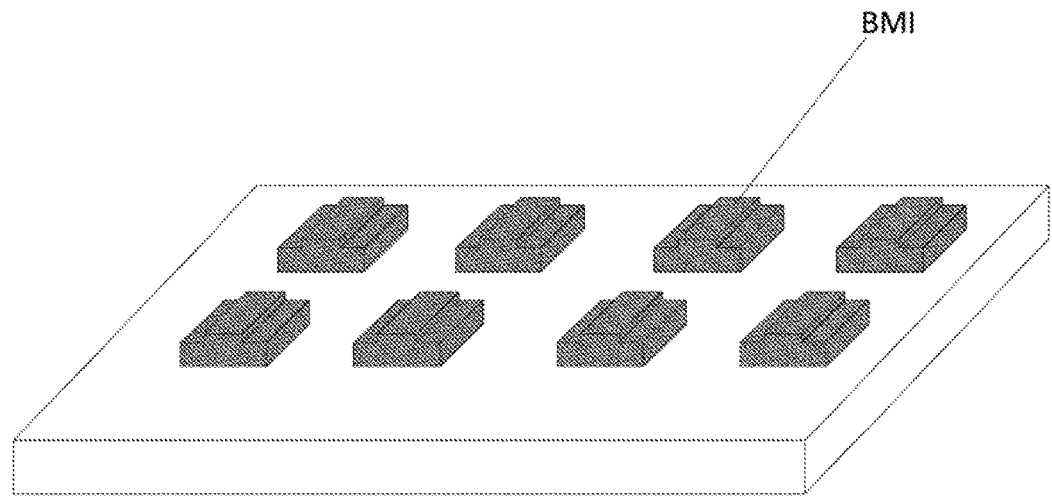
FIG. 5A-E illustrate a process of fabricating a display panel in some embodiments.
Figure 5B:
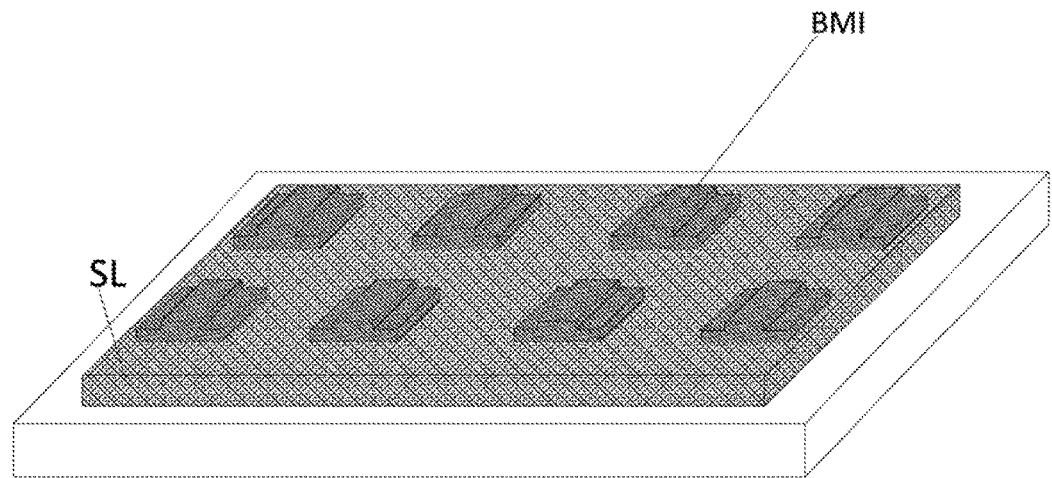

Referring to FIGS. 4B and 5B, the method further includes forming a sacrificial layer SL on the base substrate S. As shown in FIGS. 4B and 5B, the sacrificial layer SL is formed surrounding each of the plurality of black matrix islands BMI. The thickness of the sacrificial layer SL is smaller than the thickness of the black matrix island BMI. Optionally, the sacrificial layer SL is formed so that the step of each of the plurality of black matrix island BMI is exposed. In a subsequent step of forming the electroactive layer, the electroactive block may be formed onto the step of the black matrix island BMI. As discussed above, the sacrificial layer SL may be formed by various appropriate materials, including, but are not limited to, a photoresist material and a thermally decomposable material.

Figure 4C:
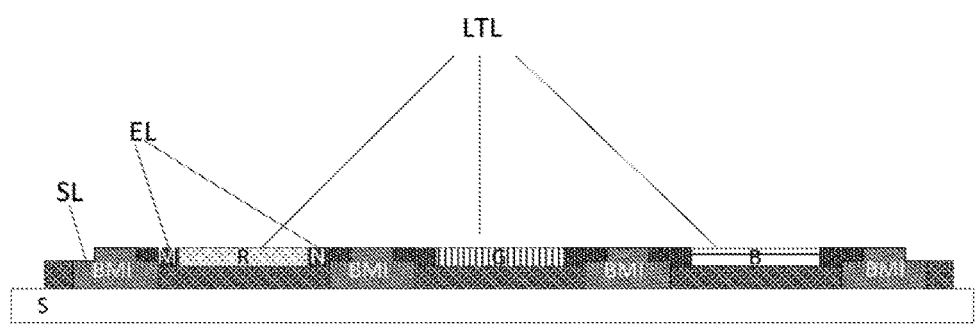
Figure 5C:
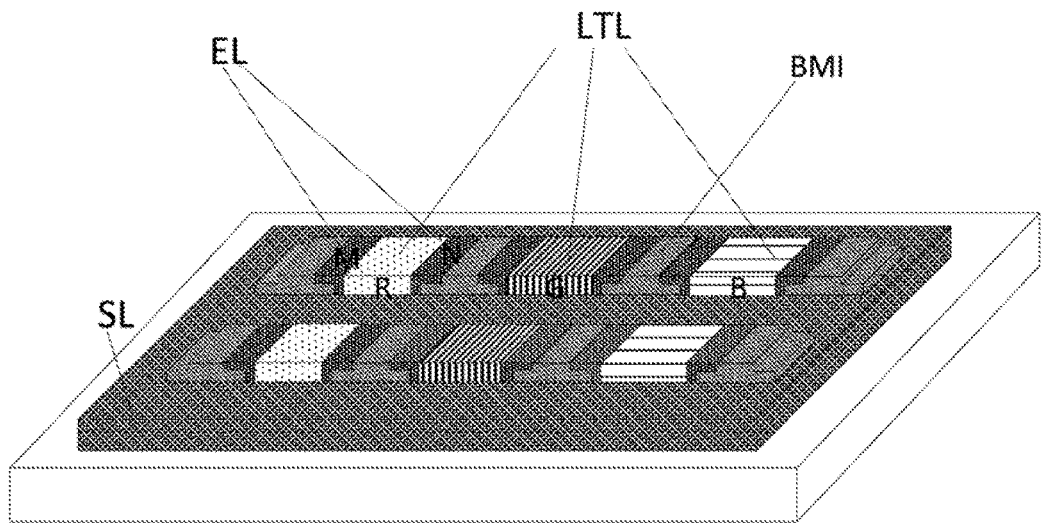

Referring to FIGS. 4C and 5C, the method further includes forming an electroactive layer EL and a light transmission layer LTL on a side of sacrificial layer SL distal to the base substrate S. As shown in FIGS. 4C and 5C, each electroactive block of the electroactive layer EL includes a first portion M and a second portion N, sandwiching a light transmission block in-between. The light transmission layer LTL in the embodiment includes a red light transmission block R, a green light transmission block G, and a blue light transmission block B. Each pair of first portion M and second portion N are disposed on two sides of a light transmission block, and are spatially coupled to the light transmission block. For examples, in a red sub-pixel, the red light transmission block R is sandwiched by a pair of a first portion M and a second portion N. The light transmission layer LTL in the embodiment also functions as a color generating layer for color image display.

Figure 4D:
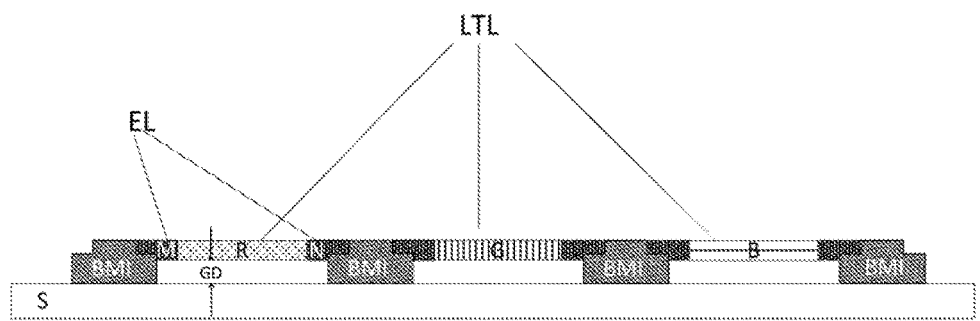
Figure 5D:
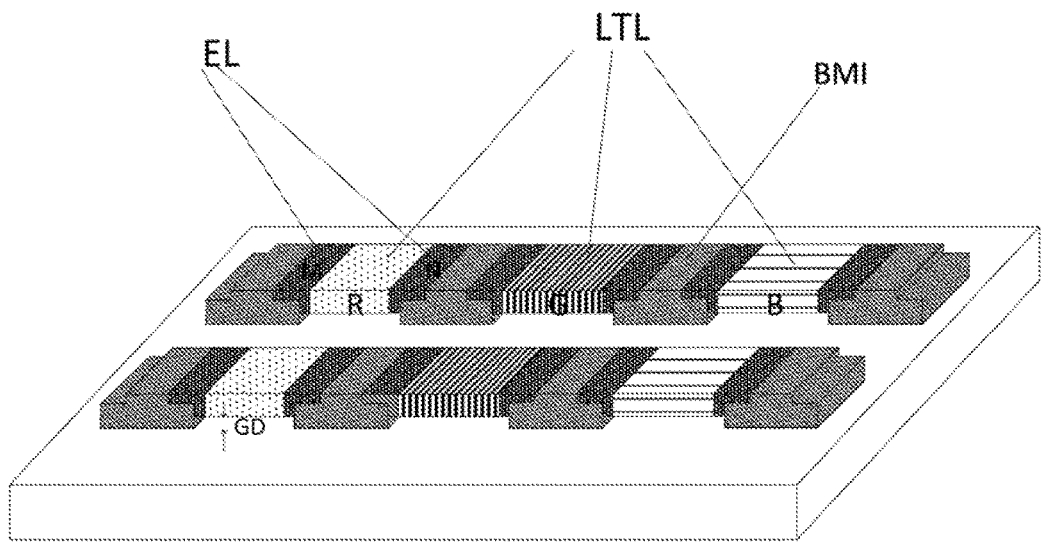

Referring to FIGS. 4D and 5D, the method further includes removing the sacrificial layer SL thereby forming the gap distance GD between each of the plurality of light transmission block and the base substrate S. As discussed above, when the sacrificial layer SL is made of a photoresist material, it may be removed by using an alkaline developing solution. When the sacrificial layer SL is made of a thermally decomposable material, it may be removed by decomposition by heat.

Figure 5E:
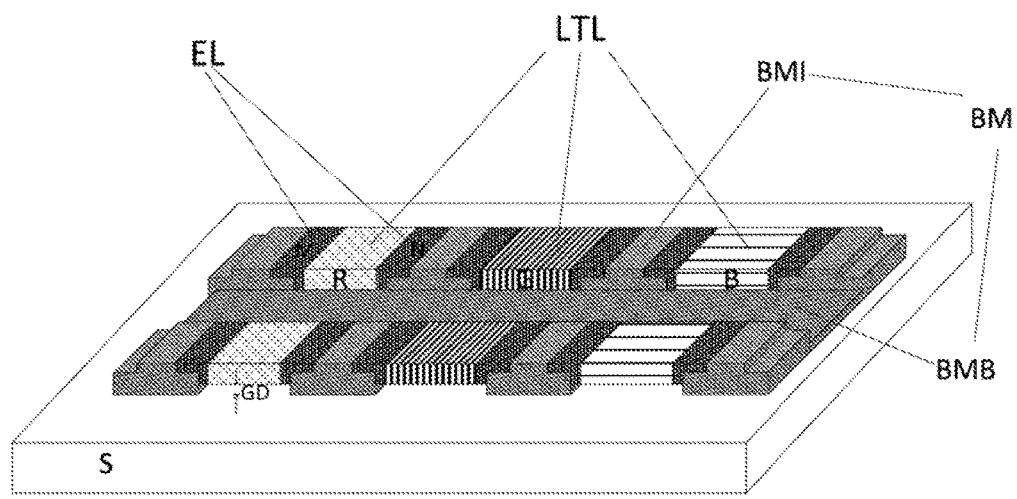

Referring to FIG. 5E, the method in the embodiment further includes forming a plurality of black matrix bridges BMB connecting the plurality of black matrix islands BMI to form the black matrix layer BM.

In another aspect, the present disclosure provides a display apparatus having a display panel described herein or fabricated by a method described herein. Examples of appropriate display apparatuses include, but are not limited to, an electronic paper, a mobile phone, a tablet computer, a television, a monitor, a notebook computer, a digital album, a GPS, etc.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display panel, comprising a base substrate, and an array of a plurality of pixels on the base substrate, each of the plurality of pixels comprising at least one subpixel;
wherein each subpixel comprises:
an electroactive layer on the base substrate; and
a light transmission layer on the base substrate configured to be actuated by the electroactive layer so that light transmittance of the light transmission layer in the at least one subpixel changes in response to a change in an electrical signal applied to the electroactive layer to achieve levels of gray scale; wherein the light transmission layer is reversibly deformable;
wherein the display panel further comprises:
a plurality of data lines configured to provide electrical signals respectively to electroactive layers of subpixels in the array of the plurality of pixels;
a plurality of thin film transistors and a plurality of gate lines for controlling image display in the array of the plurality of pixels;
wherein luminance in each individual subpixel is configured to be controlled by varying a strength and a polarity of the electrical signal provided to each subpixel.

2. The display panel of claim 1, wherein the electroactive layer is connected to the light transmission layer for changing the light transmittance of the light transmission layer based on a voltage signal applied to the electroactive layer.

3. The display panel of claim 2, wherein the light transmission layer is thickness variable for changing the light transmittance of the light transmission layer.

4. The display panel of claim 3, wherein the electroactive layer is configured to exert a force to the light transmission layer for changing a thickness of the light transmission layer in response to a change in the voltage signal applied to the electroactive layer.

5. The display panel of claim 4, wherein the electroactive layer is configured to exert a pressing force to the light transmission layer for increasing the thickness of the light transmission layer in response to the increase in positive direction and/or a decrease in negative direction in the voltage signal applied to the electroactive layer; and configured to exert a pulling force to the light transmission layer for decreasing the thickness of the light transmission layer in response to the increase in negative direction and/or a decrease in positive direction in the voltage signal applied to the electroactive layer.

6. The display panel of claim 5, further comprising a black matrix layer;
wherein each pixel includes a subpixel region and an inter-subpixel region; the black matrix layer being in the inter-subpixel region; and the light transmission layer being in the subpixel region.

7. The display panel of claim 6, wherein the electroactive layer comprises a first portion connected to the light transmission layer and the black matrix layer respectively; wherein the light transmission layer is sandwiched by the first portion and the black matrix layer.

8. The display panel of claim 6, wherein the electroactive layer comprises a first portion connected to the light transmission layer and the black matrix layer respectively; and a second portion connected to the light transmission layer and the black matrix layer respectively; wherein the light transmission layer is sandwiched by the first portion and the second portion.

9. The display panel of claim 1 wherein the light transmission layer is spaced apart from the base substrate by a gap distance variable based on a deformation of the light transmission layer.

10. The display panel of claim 1;
wherein each pixel comprises at least a first subpixel, a second subpixel, and a third subpixel, for emitting light of a first color, light of a second color and light of a third color, respectively; and
the light transmission layer comprises a first color generating block corresponding to the first subpixel, a second color generating block corresponding to the second subpixel, and a third color generating block corresponding to the third subpixel.

11. The display panel of claim 10, wherein the light transmission layer comprises a first light transmission block corresponding to the first subpixel, a second light transmission block corresponding to the second subpixel, and a third light transmission block corresponding to the third subpixel;
light transmitted through the first light transmission block having the first color, light transmitted through the second light transmission block having the second color, and light transmitted through the third light transmission block having the third color; and
the first color, the second color, and the third color are different colors selected form red, green, and blue.

12. The display panel of claim 1, wherein the electroactive layer is made of barium titanate doped polyurethane.

13. The display panel of claim 1, wherein the light transmission layer is made of a polydimethylsiloxane (PDMS)-based material.

14. A display apparatus, comprising a display panel of claim 1, and a back light configured to provide light for image display in each subpixel.

15. A method of fabricating a display panel, comprising:
forming an array of a plurality of pixels on a base substrate, each of the plurality of pixels formed to comprise at least one subpixel;
wherein forming the array of the plurality of pixels comprises:
forming an electroactive layer comprising a plurality of electroactive blocks on a base substrate; and
forming a light transmission layer comprising a plurality of light transmission blocks on the base substrate corresponding to a plurality of subpixels;
wherein the light transmission layer is formed to be actuated by the electroactive layer so that light transmittance of the light transmission layer in the at least one subpixel changes in response to a change in an electrical signal applied to the electroactive layer to achieve levels of gray scale; wherein the light transmission layer is reversibly deformable;
wherein the method further comprises:
forming a plurality of data lines configured to provide electrical signals respectively to electroactive layers of subpixels in the array of the plurality of pixels; and
forming a plurality of thin film transistors and forming a plurality of gate lines for controlling image display in the array of the plurality of pixels;

wherein luminance in each individual subpixel is configured to be controlled by varying a strength and a polarity of the electrical signal provided to each subpixel.

16. The method of claim 15, wherein each of the plurality of light transmission blocks is formed to be spaced apart from the base substrate by a gap distance.

17. The method of claim 16, comprising:
forming a sacrificial layer on the base substrate;
forming the electroactive layer and the light transmission layer on a side of sacrificial layer distal to the base substrate; and
removing the sacrificial layer thereby forming a gap having the gap distance between each of the plurality of light transmission blocks and the base substrate.

18. The method of claim 17, wherein the sacrificial layer is made of a photoresist material, and the step of removing is performed by dissolving the sacrificial layer using an alkaline developing solution.

19. The method of claim 17, wherein the sacrificial layer is made of a thermally decomposable material, and the step of removing is performing by decomposing the sacrificial layer by heat.

20. The method of claim 17, further comprising forming a black matrix layer on the base substrate; wherein the step of forming the black matrix layer comprising:

forming a plurality of black matrix islands on the base substrate prior to the step of forming the sacrificial layer; each of the plurality of light transmission blocks and each of the plurality of electroactive blocks are formed between two adjacent black matrix islands; and subsequent to the step of removing the sacrificial layer, forming a plurality of black matrix bridges connecting the plurality of black matrix islands to form the black matrix layer.

* * * * *